United States Patent
Koduri (10) Patent No.: US 6,273,321 B1
(45) Date of Patent: *Aug. 14, 2001

(54) WIRE BONDING WITH CAPILLARY REALIGNMENT

(75) Inventor: Sreenivasan Koduri, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/678,779

(22) Filed: Oct. 4, 2000

Related U.S. Application Data (62) Division of application No. 09/395,256, filed on Sep. 13, 1999, which is a division of application No. 08/993,638, filed on Dec. 19, 1996, now Pat. No. 6,215,195
(60) Provisional application No. 60/033,860, filed on Dec. 19, 1996.

(51) Int. Cl.[7] ............................. B23K 31/00; B23K 37/00; B23K 31/02
(52) U.S. Cl. ......................... 228/102; 228/180.5; 228/4.5
(58) Field of Search ................................. 228/180.5, 4.5, 228/102

(56) References Cited

U.S. PATENT DOCUMENTS

| | | | | |
|---|---|---|---|---|
| 5,465,899 | * | 11/1995 | Quick et al. | 228/180.5 |
| 5,934,543 | * | 8/1999 | Koduri | 228/102 |
| 6,006,977 | * | 12/1999 | Koduri | 228/4.5 |
| 6,112,972 | * | 9/2000 | Koduri | 228/180.5 |

\* cited by examiner

*Primary Examiner*—Tom Dunn
*Assistant Examiner*—L. Edmondson
(74) *Attorney, Agent, or Firm*—Wade James Brady, III; Frederick J. Telecky, Jr.

(57) ABSTRACT

A wire bonding method includes aligning the face of a capillary along a first direction to make a first wire bond at a first bond point. The capillary face is realigned to a second direction to make a second wire bond at a second bond point. The realignment may be achieved by a system including an wire bonding capillary having an indicator located thereon. A detector detects a signal from the indicator. The signal corresponds to a rotational alignment of the capillary and, therefore, to a direction of alignment of the capillary face. A first signal indicates a first alignment of the capillary face and a second signal indicates a second alignment of the capillary face. The signals may each have a relative signal strength which indicates rotational an offset of the capillary face from a given direction.

5 Claims, 7 Drawing Sheets

WIRE BONDING WITH CAPILLARY REALIGNMENT

CROSS REFERENCE TO PRIOR APPLICATIONS

This application is a division of application Ser. No. 09/395,256 which is a division of Ser. No. 08/993,638, now U.S. Pat. No. 6,215,195 which claims priority under 35 U.S.C. 119(e)(1) based upon Provisional application Ser. No. 60/033,860, filed Dec. 19, 1996.

TECHNICAL FIELD OF THE INVENTION

The invention generally relates to wire bonding during the process of forming integrated circuit chip packages and, more particularly, to a method of wire bonding in which the capillary may be realigned during the wire bonding process. The invention also relates to an integrated circuit chip package produced by the method and to a wire bonding system which achieves the method.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to overcome those disadvantages of prior art wire bonding systems and techniques.

It is another object of the present invention to provide an integrated circuit chip package with suitable bonds, which are closer together than bonds of known integrated circuit chip packages.

It is another object of the present invention to provide a system and method according to which a wire bonding capillary may be rotated to a precise rotational alignment both at installation and during the wire bonding process.

To meet these and other objects of the present invention, and according to a first embodiment, a method is provided for wire bonding an integrated circuit chip package. According to the method, an axis of a face of a capillary is aligned along a first direction. The capillary is used to form a first wire bond at a first bond point of the package. The axis of the face of the capillary is realigned along a second direction different from the first direction. The capillary is used to form a second wire bond at a second bond point.

According to various aspects, the realigning step may be performed before or after the step of forming a second wire bond. The first bond point may be a bond pad of an integrated circuit chip, and the second bond point may be a lead of a lead frame. The face of the capillary may be non-circular.

The method may include additional steps. The axis of the face of the capillary may be realigned along a third direction, and the capillary may be used to form a third wire bond at a third bond point. The first and third directions may be the same direction or different directions.

The capillary may include a tubular portion and at least one indicator on the tubular portion. The realigning steps may include rotating the capillary and detecting a signal from the indicator. The signal may indicate an alignment of the axis of the face of the capillary. The signal may have a signal strength, which indicates an angular offset between a desired alignment direction and the axis of the face of the capillary.

According to a second embodiment of the present invention, a system for wire bonding an integrated circuit chip package is provided. The system includes a wire bonding capillary, which has a face with an axis. A source of bonding wire is provided and the capillary is adapted to guide the bonding wire. The system also includes means for moving the capillary to position the bonding wire at one or more bond points on the integrated circuit chip package. An indicator located on the capillary provides signals to a detector spaced from the capillary. Rotation means rotates the capillary from a first rotational alignment to a second rotational alignment. A first signal received by the detector corresponds to the first rotational alignment, and a second signal received by the detector corresponds to the second rotational alignment.

According to a third embodiment, an integrated circuit chip package is provided, which includes an integrated circuit chip having at least one bond pad. A lead frame has at least one lead. A bonding wire extends from the at least one bond pad to the at least one lead. A bond between the bonding wire and the at least one bond pad is made using a capillary having a face aligned in a first direction. A bond between the bonding wire and the at least one lead is made using a capillary having a face aligned in a second direction different from the first direction.

A technical advantage of the present invention is that a capillary may be rotated to precise rotational alignments both at installation of the capillary onto a wire bonding machine and during the wire bonding process.

Another technical advantage is that the axis of a non-circular capillary face may be aligned along any desired direction for the purposes of providing wire bonds in predetermined directions.

Another technical advantage is that adjacent bonds may be located closer together without sacrificing the structural integrity of the bonds. This allows resulting integrated circuit chip packages to be made smaller without sacrificing electrical capacity.

Other aspects, features and advantages exist as will be apparent to those of ordinary skill in the relevant art in view of the detailed description in conjunction with the drawings.

BRIEF DESCRIPTION OF THE DRAWINGS

For a more complete understanding of the present invention and for advantages thereof, reference is now made to the following description taken in conjunction with the accompanying drawings, wherein like reference numerals represent like parts, in which.

DETAILED DESCRIPTION OF THE INVENTION

During the manufacture of integrated circuit chip packages, a wire bonding process is used to electrically connect bond pads on an integrated circuit chip to leads of a lead frame. This may be accomplished by a wire bonding machine which includes, among other things, a capillary for guiding bonding wire to specific bonding points. The present invention generally relates to rotational alignment and realignment of the capillary during installation of the capillary onto the wire bonding machine and during the wire bonding process as the capillary moves from one bond point to another. The ability to precisely rotate a wire bonding capillary is especially helpful when the capillary being used has a non-circular face such as disclosed, for example, in U.S. Pat. No. 5,544,804 issued to Test, et al.

Figure 1:
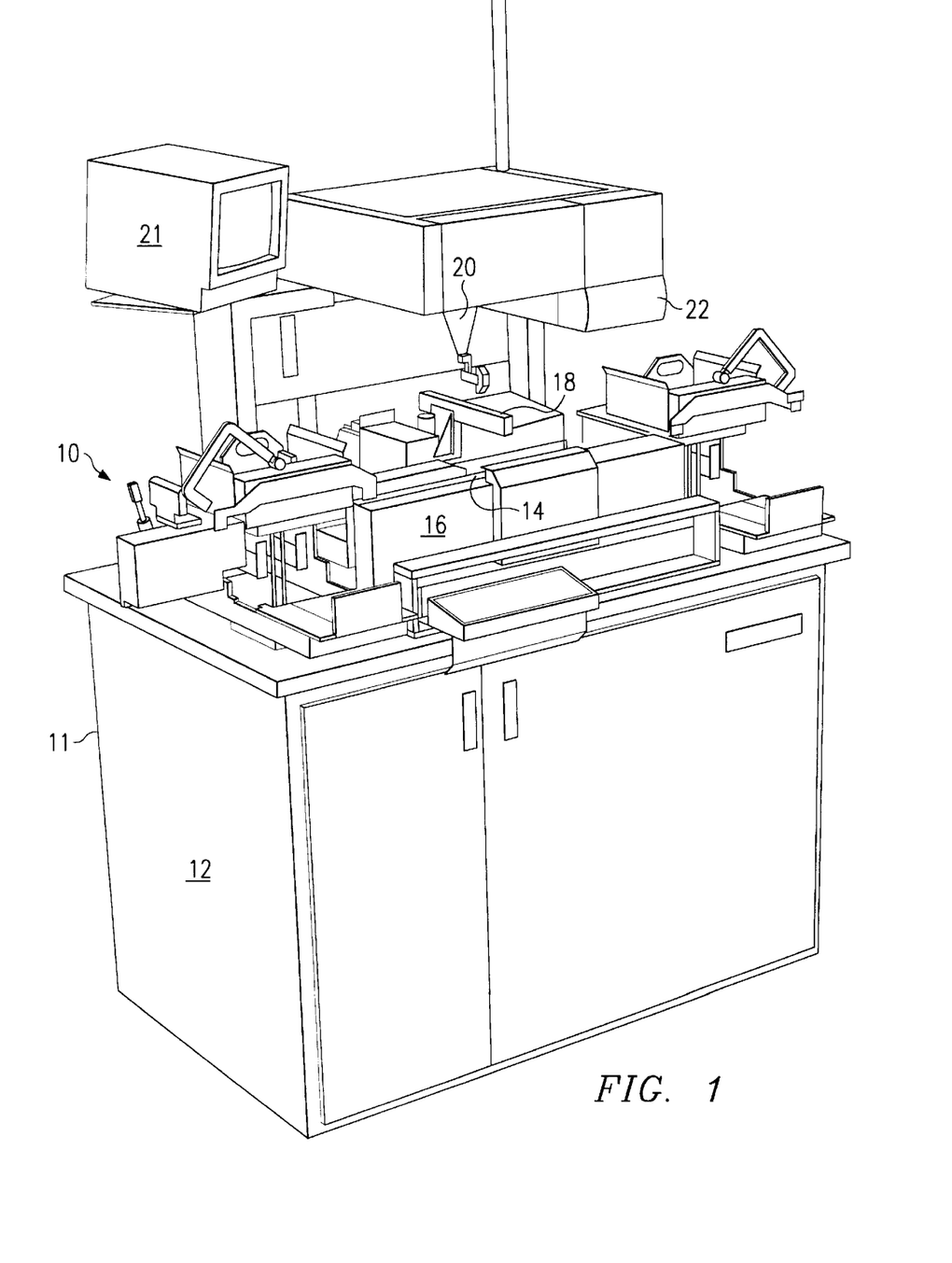
FIG. 1 is a wire bonding system according to a first embodiment of the present invention.

According to a first embodiment of the present invention, and with reference to FIG. 1, a wire bonding system 10 is provided. System 10 includes a wire bonding machine 11 having a housing 12 upon which is mounted a wire bonding assembly. Lead frames undergoing the wire bonding process rest on a bonding platform 14. A transporter 16 is included to move the lead frames with respect to a bonding apparatus 18. A bonding wire source 20 feeds bonding wire to the bonding apparatus. The functions of system 10, including movement of the lead frames and manipulation of apparatus 18, are controlled by a computer 22. Information regarding the wire bonding process is displayed on a monitor 21.

Figure 2:
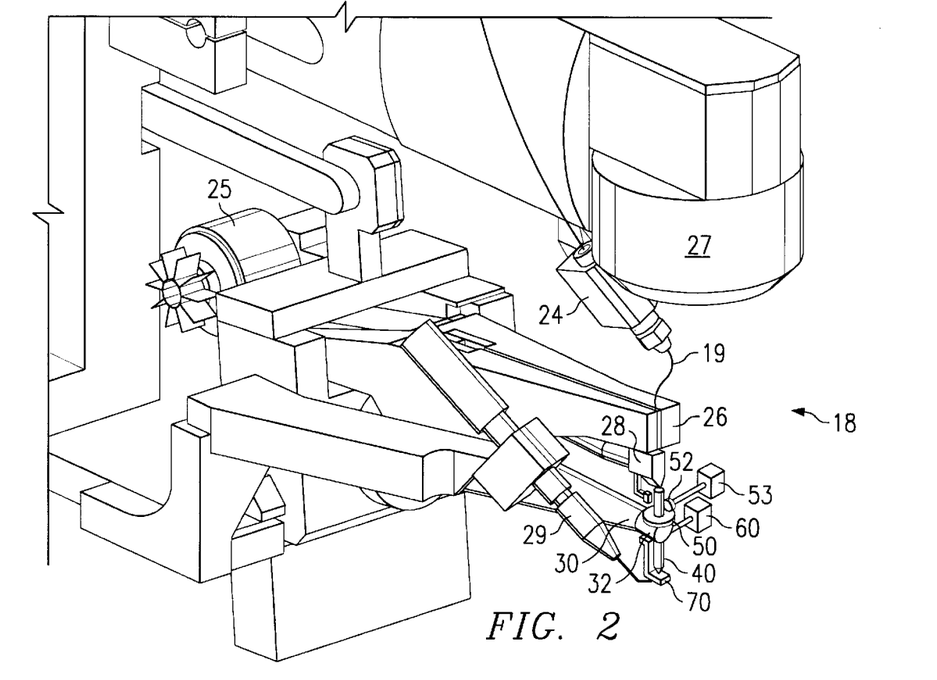
FIG. 2 is an enlarged, partial view of the wire bonding system of FIG. 1.
Figure 3:
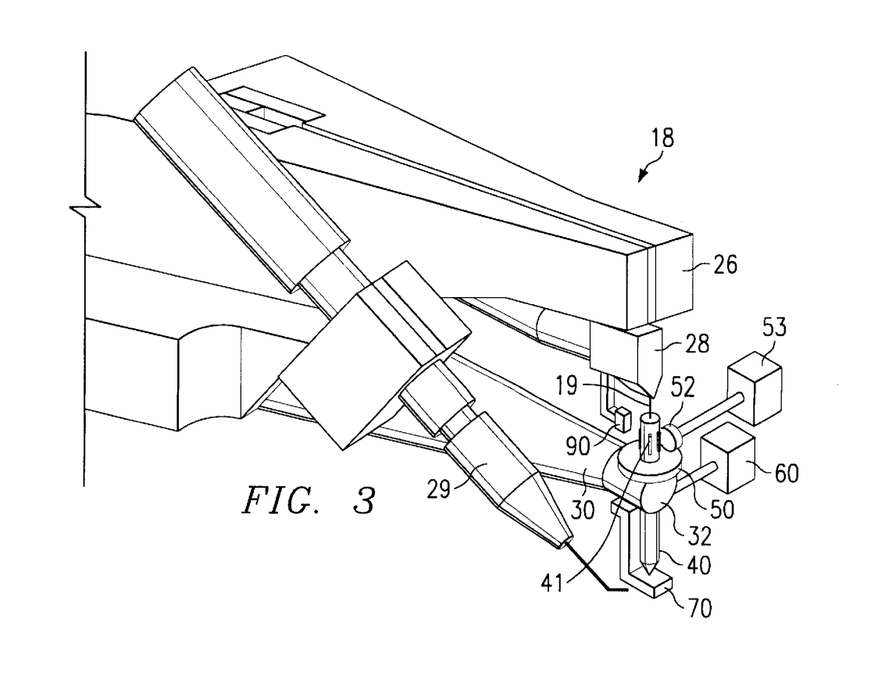
FIG. 3 is an enlarged, partial view of the wire bonding system of FIGS. 1 and 2.

Apparatus 18 is shown in expanded detail in FIGS. 2 and 3. Bonding apparatus 18 includes a horn 30 which has a capillary mounting receptacle 32. A wire bonding capillary 40 is mounted on horn 30 within receptacle 32. A rotation device 50 is coupled to capillary 40 and is cooperative with drive element 52 to rotate capillary 40 as described in greater detail below. Drive element 52 is powered by a power source 53. A locking mechanism 60 is provided to selectively lock capillary 40 into receptacle 32 and to selectively unlock capillary 40. When locking mechanism 60 is in the unlocked position, capillary 40 is free to rotate about its longitudinal axis. A selectively operable height gauge 70 is provided to limit movement of capillary 40 along its longitudinal axis when locking mechanism 60 is in the unlocked position. This ensures that the exit end of capillary 40 is at the proper height with respect to the bonding platform and the integrated circuit chip package. When not in use, height gauge 70 may be rotated away from capillary 40 or removed. Bonding wire 19 from source 20 is fed through a wire tensioner 24, through a wire clamp 26 and through a venturi 28 to capillary 40. Wire tensioner 24 maintains a proper tension on bonding wire 19 and assists in feeding wire 19 to wire clamp 26. A voice coil 25 is provided to cooperate with wire clamp 26 to provide an accurate wire clamping function. Wire 19 from clamp 26 is threaded through capillary 40 and is used to wire bond a lead frame (not shown). An electronic pulse device 29, such as an electronic flame off system, is provided to apply an electronic pulse to the bonding wire 19 which protrudes from an exit end of capillary 40. An optics system 27 is provided to view the wire bonding function and send information about the bonding area and process to the computer 22. The computer may use this information for, among other things, controlling horizontal movement of the bonding apparatus 18 to place the capillary 40 over desired locations on an integrated circuit chip package.

Capillary 40 preferably has a plurality of indicators 41 incorporated into a surface thereof. Indicators 41 cooperate with a detection device 90 to provide one or more sensing signals. The sensing signals are used to establish and determine a rotational alignment of capillary 40. The sensing signals are also used in conjunction with the rotation device 50 to rotate capillary 40 to precise rotational positions during wire bonding. This enables an axis of the face of the capillary to be properly aligned along a given bonding path.

Figure 4:
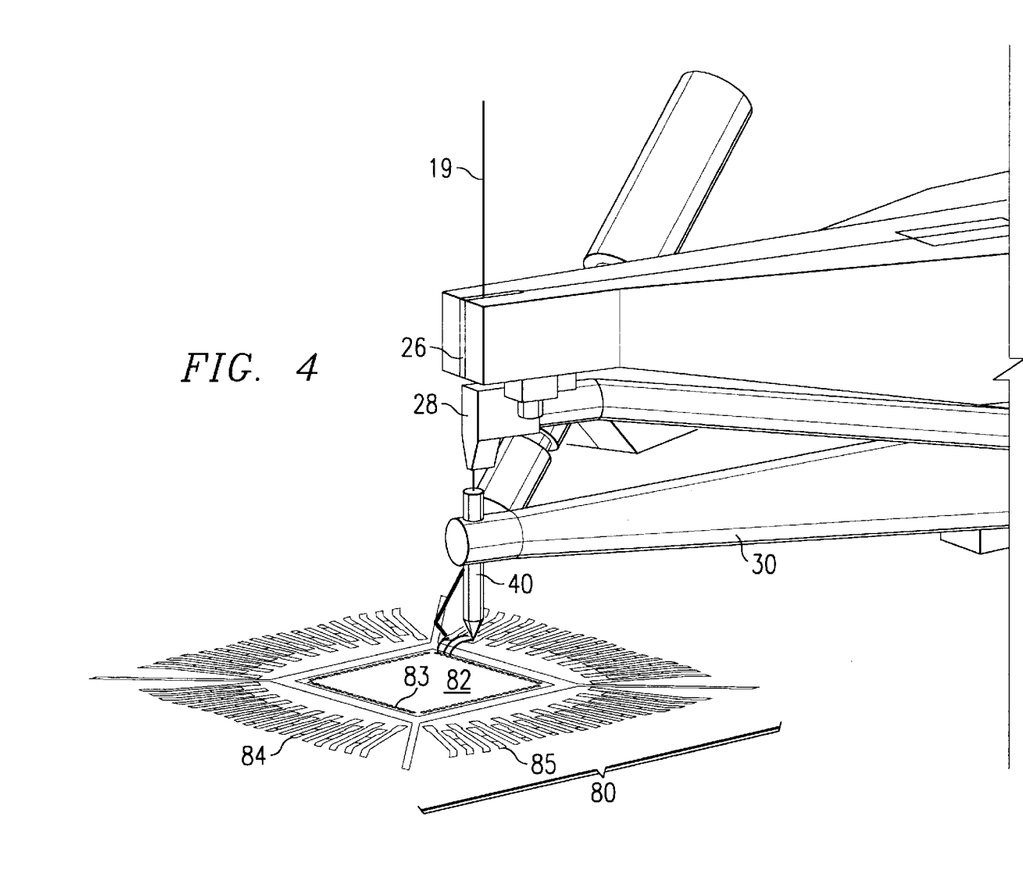
FIG. 4 depicts a wire bonding system performing wire bonding on an integrated circuit chip package in accordance with a second embodiment of the present invention.

Apparatus 18 is shown performing a wire bonding function in FIG. 4. An integrated circuit chip package 80 includes a chip 82 and a lead frame 84. Chip 82 includes a number of bond pads 83 and lead frame 84 includes a number of leads 85. At the beginning of the formation of a wire bond, wire 19 protrudes from an exit end of capillary 40 and terminates in a free end. Electronic pulse device 29 is activated to apply a high voltage negative pulse to the free end of bonding wire 19 to form a wire ball. Apparatus 18 is horizontally manipulated to place capillary 40 over a target bond pad 83 in a proper position to apply the wire ball to the target bond pad. Horn 30 is rotated about a pivot point to move the capillary up and down during wire bonding. Horn 30 moves capillary 40 downward to place the wire ball on the target bond pad 83. The pivot angle is preferably small such that the movement of the capillary 40 is substantially linear. Horn 30 may be vibrated ultrasonically to complete the bond. Horn 30 is then rotated to move capillary 40 upward and away from package 80. The apparatus 18 is again horizontally moved to place capillary 40 over a target lead so that the lead is in the proper position for receiving wire 19. As apparatus 18 moves relative to package 80, venturi 28 provides a stream of air along the path of wire 19 to assist in drawing more of the bonding wire 19 from the source 20. The wire 19 is fed through capillary 40 as apparatus 18 moves. In this step, wire 19 is strung along a precise bonding path from the bond pad to the lead. Horn 20 is rotated to move capillary 40 downward to the target lead of lead frame 84. Wire 19 is applied to the lead to create a bond at the lead. Wire clamp 26 and voice coil 25 are activated to clamp wire 19 and break off wire 19 after the bond is formed at the lead.

The integrated circuit chip packages which may be wire bonded by the machine may be any type including conventional packages having four-sided lead frames with leads spaced about each of the four sides. The axes of the leads may be perpendicular to the sides of the lead frame. However, the present invention provides particular benefits for packages having leads which extend from the lead frame at several different angles offset from perpendicular. As can be seen in FIG. 4, for example, the axis of each lead located on a given side of the lead frame is offset by a distinct angle from a line perpendicular to the side. Further, bonding paths are defined by the direction from a given bond pad to its corresponding lead. Thus, the bonding paths may also be angularly offset from perpendicular.

Capillary 40 is shown in greater detail in FIGS. 5–10. Capillary 40 includes a tubular body comprising a shaft portion 420 which is integral with a tip portion 430. The capillary has a longitudinal axis extending through the interior of the capillary in the general direction shown as line AA in FIG. 5. Capillary 40 has an entry end 440 and an exit end 450. Bonding wire may be inserted into entry end 440 to extend through the interior of capillary 40 and exit from capillary 40 through exit end 450.

Figure 6:
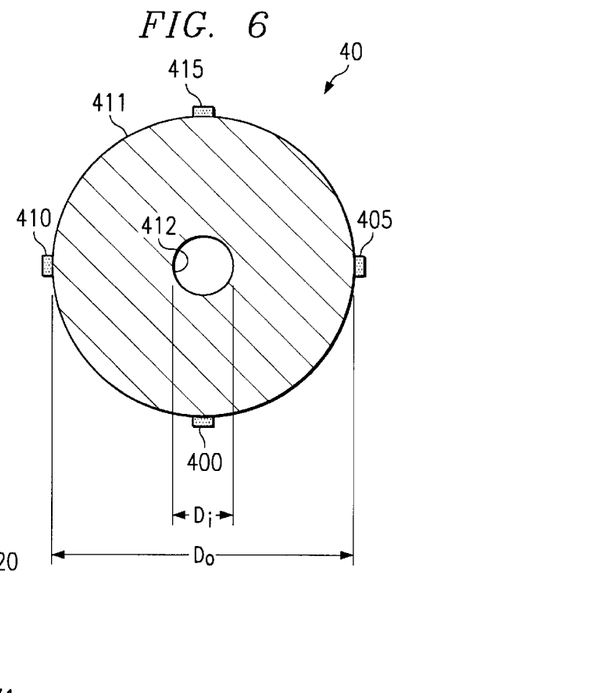
FIG. 6 is a cross-sectional view of the capillary of FIG. 5 taken in the direction of arrows 6—6.
Figure 7:
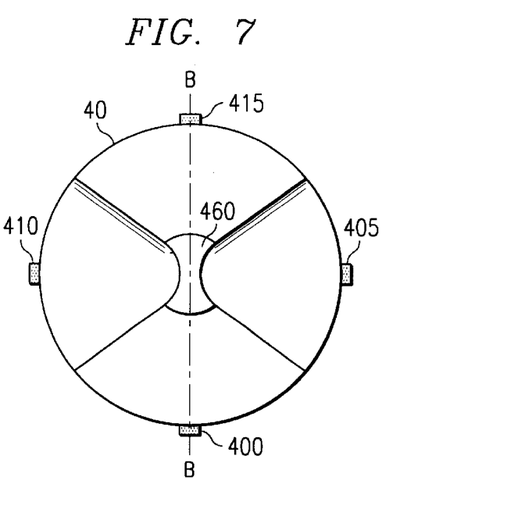
FIG. 7 is an end view of the capillary of FIG. 5 in the direction of arrows 7—7.

Preferably, shaft portion 420 is cylindrical in shape and has a circular cross section as shown more clearly in FIG. 6. However, other shapes may be used so long as the bonding wire may be threaded through the interior of capillary 40. For example, the capillary may have a rectangular or elliptical cross section. Preferably, the interior of capillary 40 is defined by an inner diameter $D_i$ and an outer diameter $D_o$. Preferably, inner diameter $D_i$ is constant throughout an entire length of capillary 40. However, if capillary 40 has a constant wall thickness, then $D_i$ will vary accordingly to changes in $D_o$.

Figure 5:
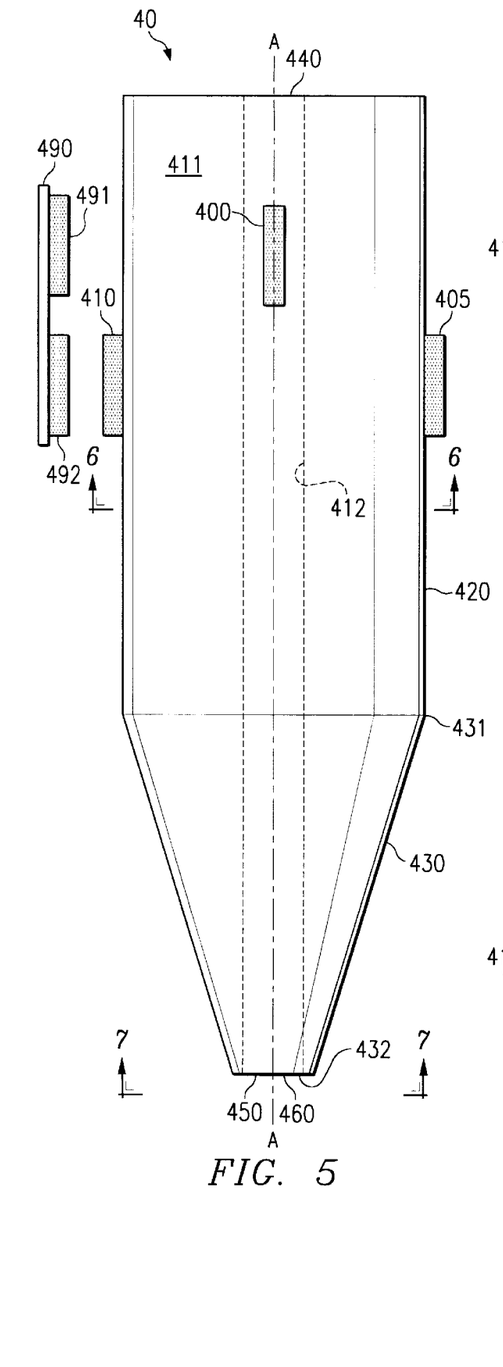
FIG. 5 is a wire bonding capillary in accordance with the present invention.

Preferably, tip portion 430 is tapered from a first point 431, where tip portion 430 meets shaft portion 420, to a second point 432 located at the exit end of capillary 40. Preferably, the outer diameter of tip portion 430 at first point 431 is equal to $D_o$ of shaft portion 420. Preferably, the outer diameter of tip portion 430 at second point 432 is a predetermined value which is less than the outer diameter at first point 431.

Capillary 40 may be formed from any suitable material. However, it is preferable that capillary 40 is formed from a high-strength material. For example, capillary 40 may be formed from a high strength ceramic material.

As shown in FIG. 6, the shaft portion 420 of capillary 40 has a circular cross section. Capillary 40 is defined by outer surface 411 and inner surface 412. A plurality of indicators 400, 405, 410 and 415 are incorporated into the tubular body of capillary 40. Although four indicators are shown, the number of indicators used may be one or more than one. The indicators cooperate with at least one detector to provide a sensing function which provides information about the rotational alignment of the capillary. A detection device 490 is shown, for example, in FIG. 5. Device 490 preferably includes a first detector 491 for detecting the primary indicator and a second detector 492 for detecting secondary indicators. The detectors provide one or more detection signals indicative of the rotational position of capillary 40.

This is particularly useful when the face 460 of capillary 40, which is located at the exit end 450, is a non-circular face. For example, in FIG. 7, the face 460 of capillary 40 is shown from an end view taken along line 7—7 of FIG. 5. Non-circular capillary face 460 has longitudinal axis BB which may be aligned, for example, with a given bonding path during the wire bonding process. The non-circular face may have any of several different shapes. For example, the face may have a bow tie or figure eight shape as shown. Alternatively, the shape may be a half bow tie. Other non-circular shapes may also be used.

Preferably, the indicators are provided about outer surface 411 of capillary 40. The indicators may be separately formed and affixed to the outer surface 411 of capillary 40 after capillary 40 has been formed. For example, depending upon the type of material used to make a particular indicator, the indicator may be bonded to outer surface 411 by a suitable bonding material which is capable of forming a secure bond between the material of the indicator and the material of the capillary.

Alternatively, the indicator may be incorporated into the capillary itself during manufacture of the capillary. For example, the indicator may be provided at the same time the capillary face is formed. This would aid in ensuring proper angular alignment of the indicator relative to a longitudinal axis of the capillary face. During operation, a desired angular alignment of capillary 40 corresponds to an angular position of at least one indicator about the longitudinal axis AA of the tubular body of capillary 40.

Preferably, at least one of the indicators is a primary indicator. For example, in FIG. 5, indicator 400 is a primary indicator. Primary indicator 400 may be used as the indicator which provides precise initial alignment of capillary 40. Primary indicator 400 may also be used to assist in rotating capillary 40 to precise rotational positions during wire bonding as the capillary moves from one bonding path to another and the bonding direction changes. The remaining indicators 405, 410 and 415 are secondary indicators, and may be used to determine angular offsets of capillary 40 or to confirm alignment after capillary 40 is rotated. Primary indicator 400 may be spaced longitudinally, either above or below, secondary indicators 405, 410 and 415. This permits easy identification of the primary indicator.

During operation, the primary indicator may be positioned on capillary 40 to correspond to a first predetermined rotational alignment of the capillary. The secondary indicators may be positioned to correspond to second, third and fourth predetermined rotational alignments of the capillary. Preferably, each of the indicators is positioned closer to entry end 440 than to exit end 450. This will provide sufficient clearance between the capillary tip and the indicators so that a process of sensing the indicators will not be affected by operation of the wire bonding machine. Also, if the indicators are too close to the tip of the capillary, they may be subject to damage from electronic pulses and heat from the electronic pulse device.

The dimensions of a given indicator depend upon the particular application, type of indicator and desired function of the indicator. In at least some applications, it is preferable to have an indicator that is relatively narrow in its horizontal dimension and relatively long in its longitudinal dimension. The relatively narrow width provides a focused detection zone which ensures that the indicator and detector are only in closest proximity over a relatively small angular range. This results in higher definition sensing by the detector. The relatively long length provides a larger longitudinal region for the sensing function to be performed. In other words, there is more longitudinal space to detect the indicator or a signal from the indicator. Preferably, the indicator's longitudinal dimension is at least as long as its horizontal dimension. More preferably, the longitudinal dimension is longer than the horizontal dimension. Even more preferably, the longitudinal dimension is at least twice as long as the horizontal dimension. The exact shape of the indicator will also depend upon the indicator type, application and desired function. A rectangular shape may be used. However, other shapes may be appropriate such as circular, triangular or elliptical shapes.

The indicators may be of a variety of types including both passive and active indicators. Preferably, the indicators are passive. This avoids the need for incorporating a power source, chemicals or complicated electronic circuitry into the indicator. Preferably, the indicators are also contactless. This means that no external components need to come into contact with the indicators in order to provide the sensing function necessary to achieve alignment.

For example, the indicator may be an optical indicator. In the case of a passive optical indicator, the indicator may comprise a reflector or mirror or a highly polished material. Alternatively, the indicator may be an etch or other intentionally-created surface defect which produces an optical interference during sensing by an optical detector.

A second type of contactless indicator which may be used is a magnetic indicator. In this case, the indicator may be formed from a magnetic material and the detector may be formed from a complimentary material which causes a measurable magnetic attraction between the detector and the indicator. The magnetic attraction would naturally be strongest when the indicator and detector are in closest proximity. In the case of a capillary having a shaft with a circular cross section, such as shown in FIG. 6, for any given indicator there will only be one point when the indicator and the detector are in this closest proximity. Preferably, capillary 40 is in a desired alignment at this point. For example, when the primary indicator 400 and first detector 491 are in their closest proximity, it may be desirable to have the longitudinal axis BB of noncircular capillary face 460 aligned in accordance with an initial alignment.

A contact-type indicator may also be used. One type of contact indicator is an electrical indicator. This may comprise any conductive material. Preferably, if the indicator is in the appropriate location such that capillary 40 is aligned as desired, a detector will be in contact with the indicator. The detector may comprise, for example, a pair of electrical leads coupled to an electrical circuit. The indicator thus completes the electrical circuit which may signal detection and, therefore, proper alignment of the capillary.

A mechanical indicator may also be used. A mechanical indicator may comprise a notch, a hole, a protrusion or some other mechanical-type feature which may be sensed upon contact by a detector. As another example, part or whole of the capillary outer surface may be planar. A mechanical indicator may also be contactless. For example, a laser may be used as the detector to detect a mechanical indicator without physical contact.

Preferably, the indicators are proximity-type indicators. This means that detection or sensing is determined by how close the indicator is to the detector. According to one possible configuration, sensing is only achieved when the indicator and detector are in their closest proximity to one another. Preferably, however, a variable strength detection signal is provided. If a variable strength detection signal is provided, the detection signal is strongest when the indicator and detector are in their closest proximity to one another. The signal weakens as the detector and indicator move away from one another. For example, depending on the type of indicator and detector used, a detection signal may still be produced even if the indicator is angularly offset from the detector. In this case, the angle of offset may be determined from the relative strength or weakness of the detection signal with reference to a minimum value (as when the indicator is furthest from the detector) and a maximum value (as when the indicator and detector are in closest proximity).

The ability to set a precise initial rotational alignment and to rotate the capillary to a precise angular offset during wire bonding is especially beneficial when using a capillary with a non-circular face such as face 460. These features enable an operator or a computer control system to align and realign the axis of the non-circular capillary face along any desired direction, including the bonding path currently being followed for a given wire bond.

Figure 8:
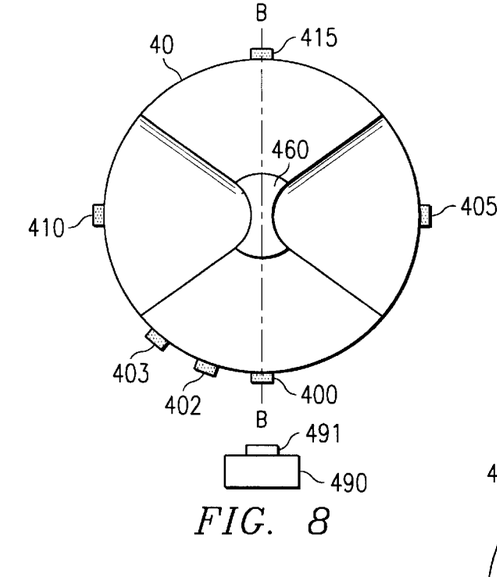
FIG. 8 is an end view of a capillary in accordance with the present invention.

As an example of operation, the indicators may be passive optical indicators. For instance, if a mirror is used, a beam of light from a source (not shown) may be directed to the mirror and reflected from the mirror to be received by detection device 490. Detectors 491 and 492 should be positioned so as to detect the indicator, or a signal therefrom, when the indicator is in a position corresponding to a predetermined rotational alignment. For example, as shown in FIG. 8, primary indicator 400 may be positioned on capillary 40 such that when primary indicator 400 is in a first predetermined position, capillary 40 is in a precise initial rotational alignment. Thus, when primary indicator 400 is in the first predetermined position, a longitudinal axis BB of capillary face 460 is preferably aligned according to a first desired rotational position. For example, during operation, axis BB of non-circular capillary face 460 may be aligned along a first bonding path between a bond pad and corresponding lead of the integrated circuit chip package. When the capillary face 460 is properly aligned along the first bond path, the detection signal strength is at a first corresponding value, which may be a maximum value if the primary indicator 400 and first detector 491 are in closest proximity.

Figure 9:
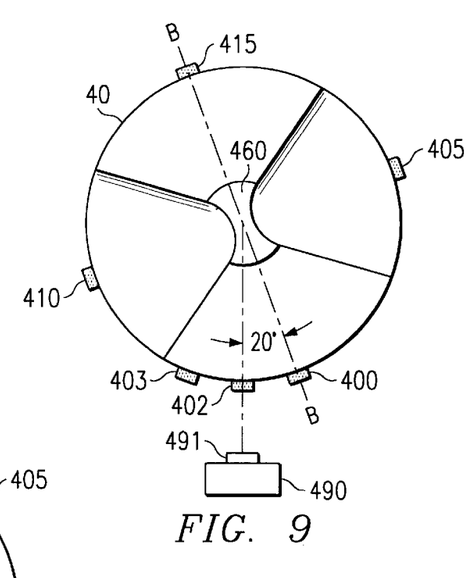
FIG. 9 depicts rotation of the capillary of FIG. 8.

After a wire bond is made along the first bond path corresponding to the first rotational alignment, it may be necessary to rotate the capillary to a second rotational alignment, which is different from the first rotational alignment. This will be necessary, for example, if the next bond path is angularly offset from the first. If the sensing function provides a variable detection signal, a second detection signal strength will correspond to the angular offset of primary indicator 400 from detector 491 when the capillary 40 is in the correct second rotational alignment. This second signal strength will be something less than the first signal strength and may be determined by calibration or some other suitable technique. As shown in FIG. 9, for example, if the second bond path is offset from the first bond path by twenty degrees, a particular second signal strength will correspond to primary indicator 400 being offset by twenty degrees. When capillary 40 is rotated to the position shown in FIG. 9, the detection signal strength will indicate that capillary 40 is in the correct second rotational alignment. Thus, face 460 is properly aligned with the second bond path.

Figure 10:
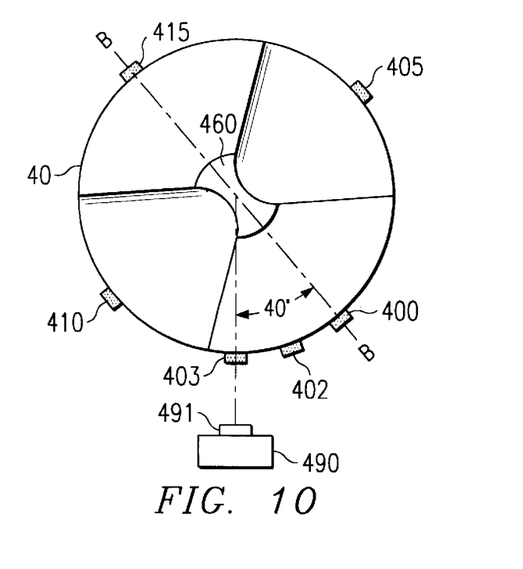
FIG. 10 depicts rotation of the capillary of FIG. 8.

If the next bond path is offset another twenty degrees, a particular detection signal strength will correspond to primary indicator 400 being offset from the initial alignment by a total of forty degrees for the initial alignment. As shown in FIG. 10, for example, a third bond path is offset an additional twenty degrees from the second bond path shown in FIG. 10. When capillary 40 is rotated to this third rotational alignment, a third detection signal strength indicates that primary indicator 400 is offset from the initial alignment by forty degrees. Therefore, face 460 is properly aligned with the third bond path.

As an alternative or a supplement to a variable signal strength, other indicators (e.g., secondary indicators) may be positioned to correspond to the second, third and subsequent rotational alignments. For instance, as shown in FIGS. 8–10, primary sensor 400 is aligned along an initial bond path. Secondary indicators 402 and 403 are aligned along the second and third bond paths, respectively.

According to a second embodiment of the present invention, a method is provided for wire bonding an integrated circuit chip package. An integrated circuit chip is mounted on a lead frame. A bonding wire is guided by a capillary to a first bond point. The first bond point may be any lead or bond pad and may be, for example, a bond pad located at an end of a predetermined side of the lead frame. A first wire bond is made at the first bond point. The bond may be any type of bond including, without limitation, ball, stitch and wedge bonds. To make the first bond, the capillary is moved transversely to a position over the first bond point. The capillary is rotated to a first rotational alignment. Accordingly, an axis of the face of the capillary may be aligned along the first rotational alignment. The first rotational alignment may align the face axis along the X or Y direction, or along an angle offset from the X or Y direction. If the first bond point is a bond pad existing in the X direction of the lead frame, for example, the first rotational alignment aligns the face axis along the X direction. The capillary is also moved along its longitudinal axis toward the first bond point. If the first bond point is a bond pad, the bonding wire may be first subjected to an electronic pulse from an electronic pulse device.

After the first bond is made, the capillary is moved along its longitudinal axis away from the first bond point. The capillary is moved transversely to a position over a second bond point. The second bond point may be, for example, a lead corresponding to the bond pad. The capillary is rotated to a second rotational alignment. The second rotational alignment preferably aligns the axis of the capillary face with either the lead axis, the bonding path, or both if the lead axis is parallel to the bonding path. If the lead axis lies along the X or Y direction, the second rotational alignment aligns the face axis along the X or Y direction, respectively. If the lead axis is offset by an angle from either the X or Y direction, the second rotational alignment aligns the face axis along the lead axis in the direction of offset. The capillary is moved along its longitudinal axis toward the second bond point and the bonding wire is brought into contact with the second bond point to form the second bond. The bond wire is preferably broken at the second bond point if the second bond point is a lead.

After the second bond is formed, the capillary is moved along its longitudinal axis away from the second bond point. The capillary is moved transversely to a position over a third bond point. The capillary is rotated to a third rotational alignment which aligns the face axis along the X or Y direction or along some axis offset by an angle from the X or Y direction. If the third bond point is second bond pad and the second bond pad is located in the X direction of the lead frame, for example, then the third rotational alignment is preferably the same as the first rotational alignment (e.g., the face axis is aligned along the X direction). Alternatively, if the third bond point is a second bond pad located in the Y direction of the lead frame, for example, the third rotational alignment may be ninety degrees offset from the first rotational alignment. The capillary is moved along its longitudinal axis toward the third bond point and the bonding wire is brought into contact with the third bond point to form a third bond.

After the third bond is formed, the capillary is moved along its longitudinal axis away from the third bond point. The capillary is moved transversely to a position over a fourth bond point which may be, for example, a second lead corresponding to the second bond pad. The capillary is rotated to a fourth rotational alignment to align the face axis along either the X or Y direction, or along an axis offset from either the X or Y direction. For example, if the fourth bond point is a lead located in the X direction of the lead frame with a lead axis oriented in the X direction, the fourth rotational alignment would align the face axis along the X direction. Alternatively, if the lead axis is offset from the X direction by an angle, the fourth rotational alignment would align the face axis along the direction of the offset angle. If the second and fourth bond points are leads having parallel axes, then the second and fourth rotational alignments are preferably the same. Alternatively, if the second and fourth bond points are leads with nonparallel axes, then the second and fourth rotational alignments are preferably different by the angular offset of the second lead axis from the first lead axis.

Rotation of the capillary may be achieved by using a detector to detect a signal from an indicator on the capillary. This may be accomplished as described in connection with system 10 above.

The foregoing method is provided as an example only. It is intended to represent a method of forming an integrated circuit chip package in which a wire bonding capillary is rotated to different rotational alignments during a process of wire bonding the integrated circuit chip package.

According to a third embodiment of the present invention, an integrated circuit chip package is provided. The integrated circuit chip package has an integrated circuit chip and a lead frame. The integrated circuit chip is wire bonded to the lead frame. This may be accomplished, for example, by bonding an end of a bonding wire to a bond pad on the chip, extending the bonding wire to a corresponding lead, and bonding the bonding wire to the lead. This process may be repeated for other bond pads and leads. The integrated circuit chip package has at least one first bond oriented in a first direction, which may be the X or Y direction, or a direction angularly offset from the X or Y direction by a first offset angle. The package has at least one second bond oriented in a second direction different from the first direction. The package may have other bonds which are oriented in either the first or second direction, or in one or more directions different from the first or second directions. The direction of bonding may be achieved using any of the previously discussed methods. The direction of bonding may be achieved by rotating the capillary to precise rotational alignments in which the axis of the capillary face is aligned along either the X or Y direction or along an axis angularly offset from the X or Y direction. Precise rotational alignment may be achieved as previously described by detecting a signal from an indicator on the capillary.

Figure 11:
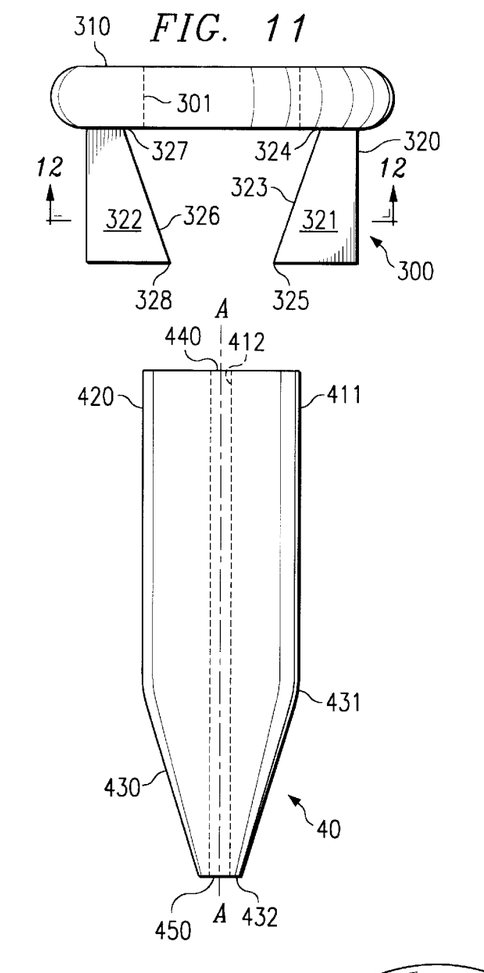
FIG. 11 is a capillary and rotation device in accordance with an aspect of the present invention.
Figure 12:
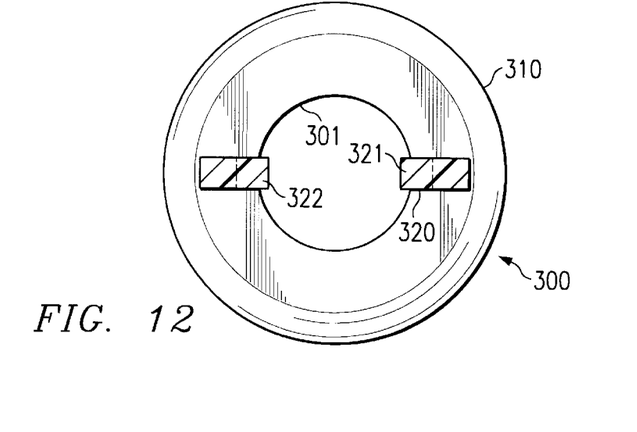
FIG. 12 is a cross-sectional view of the rotation device of FIG. 11 taken in the direction of arrows 12—12.
Figure 13:
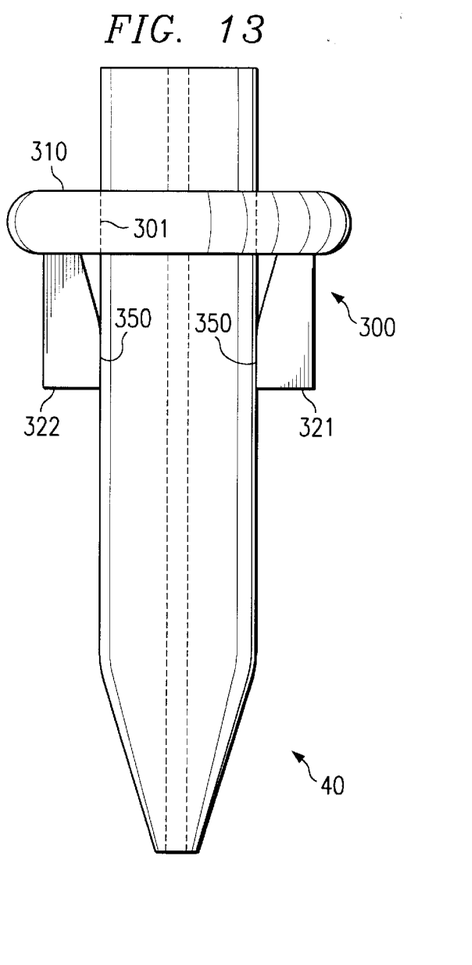
FIG. 13 depicts the rotation device and capillary of FIG. 11 coupled together.

The present invention also encompasses a tool to assist in rotating the capillary. The tool may be used, for example, as rotation device 50 shown in FIGS. 2 and 3. Referring to FIGS. 11–13, for example, a capillary holder has an extension which is designed to hold the capillary by contacting an outer surface of the capillary. More specifically, as shown in FIG. 11, capillary holder 300 comprises base 310 and extension 320. Extension 320 includes a first projection 321 and a second projection 322. Preferably, projections 321 and 322 are integral with base 310.

First and second projections 321 and 322 each have a protrusion oriented such that the protrusions extend toward one another. As shown in FIG. 11, for example, the longitudinal sections of projections 321 and 322 are trapezoidal in shape. First projection 321 has a first protrusion, which is first flared portion 323. Portion 323 is flared from a first point 324 located at the base to a second point 325 located at a terminal end of first projection 321. Second projection 322 has a second protrusion, which is second flared portion 326. Portion 326 is flared from a first point 327 located at the base 310 to a second point 328 located at a terminal end of second projection 322.

Preferably, a distance between second points 325 and 328 is less than $D_o$ of capillary 40. Preferably, a distance between first points 324 and 327 is greater than $D_o$. Preferably, as shown in FIG. 12, first and second projections 321 and 322 each have a cross-sectional shape which is rectangular. When capillary holder 300 is placed onto capillary 40, first and second flared portions 323 and 326 are preferably compressed to push inwardly against the outer surface 411 of capillary 40 as shown, for example, at points 350 in FIG. 13. This allows capillary holder 300 to grip capillary 40 by holding capillary 40 between first and second projections 321 and 322 due to contact between the respective surfaces thereof. Preferably, this contact is frictional. Also, in this embodiment, since first and second projections have rectangular cross sections, they also have flat inner edges. Therefore, if the capillary 40 has a circular cross section, then the first and second projections will contact capillary 40 at two points.

Both the capillary and the projections may have other shapes and still provide a holding function by contact between the extension 320 and the outer surface 411 of capillary 40. For example, the first and second projections may have flared protrusions, each having an arcuate inner edge (e.g., generally located in the regions designated by second points 325 and 328, respectively, in FIG. 11). This would allow contact between the first and second projections and outer surface 411 at an infinite number of points. Alternatively, if capillary 40 has flat portions on its outer surface, then the flat inner edges of projections 321 and 322 may be able to contact capillary 40 at an infinite number of points.

In FIG. 11, capillary holder 300 and capillary 40 are shown in a rest state. That is, these elements are shown in a state in which they are not coupled and capillary holder 300 is not providing a holding function. In FIG. 13, capillary holder 300 is in a holding state. In other words, capillary holder 300 is shown to be coupled to capillary 40. Due to the dimensions and compressive features described above, a rest state distance between the points of capillary holder 300 which contact capillary 40 (e.g., at 350) is less than the holding state distance between these points.

It should be noted that capillary holder 300 can provide a holding function after the capillary is installed onto a wire bonding machine and during the wire bonding process. For instance, as shown in FIG. 13, capillary holder 300 can be provided with a hole 310 extending along its longitudinal centerline to accommodate capillary 40. Hole 301 extends through the center of base 310. Thus, capillary holder 300 may assist in rotation of the capillary if needed. Rotation of holder 300 would impart rotation to the capillary.

The base of the holder shown constitutes a friction pad which may cooperate with a similar structure coupled to or integral with drive element 52 (FIGS. 2 and 3). However, other alternative structures may be used. For example, the base of the rotation device and the drive element can incorporate interfitting gears of any suitable type. Other alternative aspects are disclosed, for example, in copending U.S. Pat. No. 5,927,587 and U.S. patent application Ser. No. 08/993,659 now U.S. Pat. No. 6,112,972 each of which is assigned to Texas Instruments Incorporated. These two applications were filed on Dec. 19, 1996 and are hereby incorporated by reference for all purposes.

Figure 14:
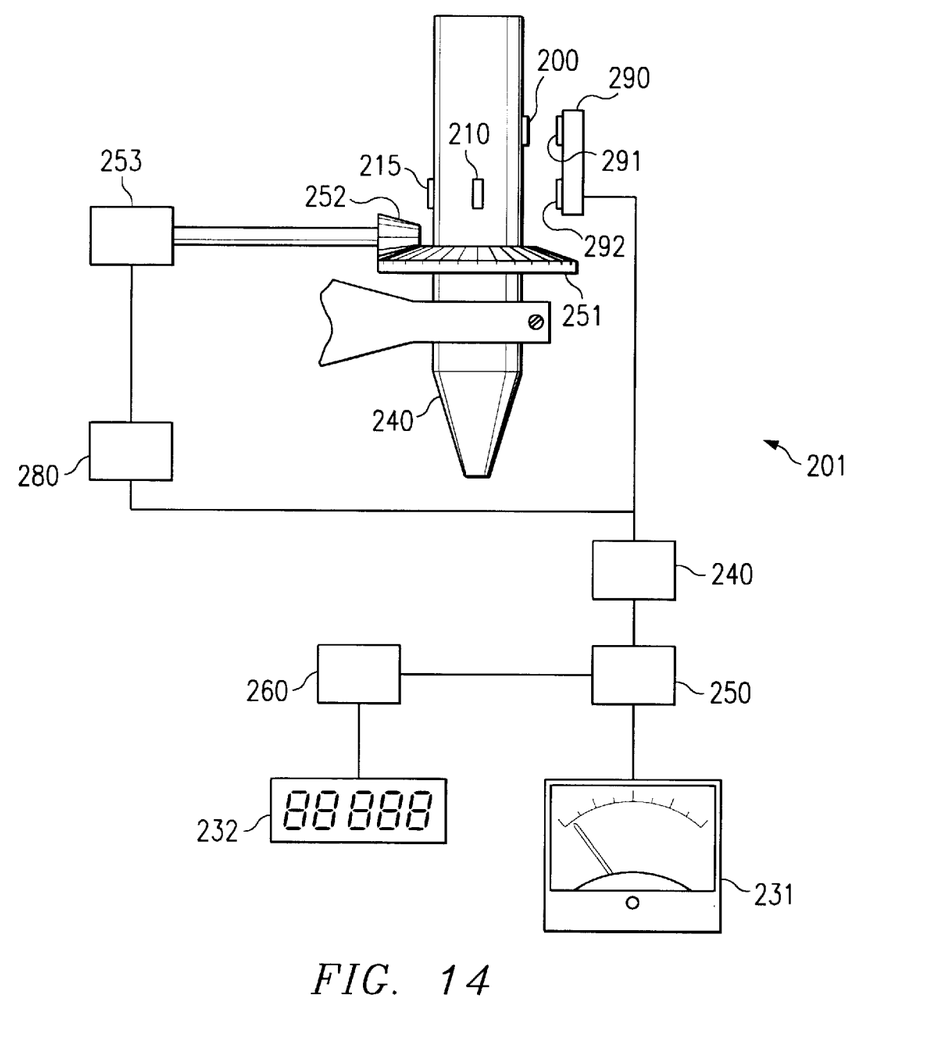
FIG. 14 is a display system in accordance with another aspect of the present invention.

The present invention also includes a display system 201 for displaying the detection signal. Display system 201 may include a capillary, indicators and detectors as described above. Preferably, one or more sensing signals are output to at least one display device. For example, as shown in FIG. 14, capillary 240 has indicators 200, 205, 210 and 215 coupled thereto. Detection device 290 receives one or more sensing signals from the indicators and provides the sensing signals to a first display 231 and a second display 232. First display 231 is an analog display for indicating the strength of a sensing signal output from detection device 290. Second display 232 is a digital display for indicating the strength of a sensing signal output from detection device 290. First and second displays 231 and 232 may indicate the strength of the same signal or may indicate the strengths of first and second signals or multiple signals. For example, first display 231 may indicate the strength of a first signal output by first detector 291 while second display 232 indicates the strength of a second signal output by second detector 292.

Preferably all output from the detection device 290 is passed through a filter 24,0 and an amplifier 250. Also, signals passed to digital display 232 should be passed through an analog-to-digital converter 260.

Rotation of capillary 240 is preferably provided by a rotation device. In the example, shown in FIG. 4, rotation device 251 comprises a gear which is coupled to capillary 240 and which interfits with drive element 252. Drive element 252 is rotated by a power supply 253. Power supply 253 is coupled to the drive element 252 by a drive shaft. Power supply 253 rotates drive element 252, which engages rotation device 251 to rotate rotation device 251. Because rotation device 251 is coupled to capillary 240, rotation is consequently imparted to capillary 240.

Rotation device 251 may comprise a holder, as previously described, which grips a surface of capillary 240. Optionally, rotation device 251 may include a rotation element coupled to, and surrounding, capillary 240 about a central portion thereof. The rotation device and drive element combination may include any suitable system of gears or friction pads. In another alternative, the rotation system is replaced by an operator who manually turns capillary 240. Preferably, power supply 253 is connected to a computer/controller 280 which is also connected to an output of detection device 290. Computer 280 receives a signal input from detection device 290 and feeds corresponding messages to power supply 253. Thus, system 201 is preferably a closed-loop system and the entire alignment process, including the sensing and rotating functions, may be fully automated.

To achieve a precise initial alignment, for example, primary indicator 200 may be positioned on capillary 240 such that when primary indicator 200 is in a first predetermined position, capillary 240 is in a precisely correct initial alignment. First detector 291 may be positioned to receive a signal (e.g., a reflected beam of light) when primary indicator 200 is in the correct initial angular position. System 200 can also be used to rotate capillary 240 to desired rotational alignments and to confirm rotational alignment during the wire bonding process. Other alternative aspects of the display system are disclosed in U.S. patent application Ser. No. 08/993,101 now U.S. Pat. No. 6,006,977 assigned to Texas Instruments Incorporated. This application was filed on Dec. 19, 1996 and is hereby incorporated by reference for all purposes.

As an alternative to steady rotation and the use of indicator/detector arrangements, rotation of the capillary may be provided in a stepwise manner. For instance, a click ring device may be coupled to the capillary and selectively activated to advance the capillary about its longitudinal axis by predetermined angular amounts. Optionally, a cam and roller arrangement may be used to accomplish the same result. various alternative aspects of stepwise rotation are disclosed in U.S. patent application Ser. No. 80/992,270 now U.S. Pat. No. 5,996,687 assigned to Texas Instruments Incorporated. This application was filed on Dec. 19, 1996 and is hereby incorporated by reference for all purposes.

The present invention has thus been described in connection with the preferred embodiments, which are intended as examples only. It will be appreciated by those having ordinary skill in the relevant art that modifications may be made to these embodiments without departing from the scope and spirit of the invention as defined by the appended claims.

What is claimed is:

1. A method of wire bonding an integrated circuit chip package, the method comprising the steps of:

provinding a capillary having at least one indicator thereon for use in determination of the rotational position of said capillary;

aligning an axis of a face of a capillary along a first direction by rotation of said capillary in response to the position of said indicator;

using the capillary to form a first wire bond at a first bond point of the package;

realigning the axis of the face of the capillary along a second direction different from the first direction by rotation of said capillary in response to the position of said indicator; and using the capillary to form a second wire bond at a second bond point.

2. The method of claim 1 wherein said capillary includes a longitudinal axis extending along the length thereof, further including a plurality of said indicators disposed about said longitudinal axis.

3. The method of claim 2 wherein each of said plurality of indicators extends through a single plane disposed normal to said longitudinal axis.

4. The method of claim 2 wherein one of said indicators is a primary indicator providing a reference for rotation of said capillary.

5. The method of claims wherein said primary indicator extends only through a first plane disposed normal to said longitudinal axis and the other of said plurality of indicators extend through a second plane disposed normal to said longitudinal axis and spaced from said first plane.

* * * * *